(12) United States Patent
Zhang et al.

(10) Patent No.: US 11,990,415 B2
(45) Date of Patent: May 21, 2024

(54) SEMICONDUCTOR DEVICE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Tiantian Zhang, Shanghai (CN); Xuezhen Jing, Shanghai (CN); Zheyuan Tong, Shanghai (CN); Zhangru Xiao, Shanghai (CN); Hailong Yu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 614 days.

(21) Appl. No.: 16/991,655

(22) Filed: Aug. 12, 2020

(65) Prior Publication Data
US 2021/0050302 A1    Feb. 18, 2021

(30) Foreign Application Priority Data
Aug. 13, 2019   (CN) .......................... 201910744276.3

(51) Int. Cl.
*H01L 21/768*  (2006.01)
*H01L 23/522*  (2006.01)
*H01L 23/532*  (2006.01)

(52) U.S. Cl.
CPC .... *H01L 23/53266* (2013.01); *H01L 21/7684* (2013.01); *H01L 21/76843* (2013.01); *H01L 21/76877* (2013.01); *H01L 23/5226* (2013.01)

(58) Field of Classification Search
None
See application file for complete search history.

(56) References Cited

U.S. PATENT DOCUMENTS

| | | | | |
|---|---|---|---|---|
| 5,747,384 | A * | 5/1998 | Miyamoto | ........ H01L 21/28518 |
| | | | | 257/E21.17 |
| 2013/0082393 | A1 * | 4/2013 | Kawamura | ....... H01L 21/76897 |
| | | | | 257/773 |
| 2017/0338148 | A1 * | 11/2017 | Shusterman | ...... H01L 23/53252 |
| 2017/0365555 | A1 * | 12/2017 | Choi | .................... H01L 23/485 |
| 2020/0343349 | A1 * | 10/2020 | Hung | ................ H01L 21/76805 |

FOREIGN PATENT DOCUMENTS

JP     H0594999 A  *  4/1993  ............. H01L 29/78

* cited by examiner

*Primary Examiner* — Bradley Smith
(74) *Attorney, Agent, or Firm* — Anova Law Group, PLLC (57) ABSTRACT

A semiconductor device and method for forming same are provided. The method for forming a semiconductor device includes: providing a base; forming an interlayer dielectric layer over the base; forming contact holes by etching the interlayer dielectric layer; forming a barrier layer over the base in the contact holes; and forming a metal layer over the barrier layer. The contact holes exposed a portion of a surface of the base. The metal layer fully filled the contact hole.

12 Claims, 5 Drawing Sheets

SEMICONDUCTOR DEVICE AND METHOD FOR FORMING THE SAME

CROSS-REFERENCE TO RELATED APPLICATION

This application claims priority to Chinese Patent Application No. 201910744276.3, filed on Aug. 13, 2019, the entire content of which is incorporated herein by reference.

TECHNICAL FIELD

The present disclosure generally relates to the field of semiconductor manufacturing technology and, more particularly, to a semiconductor device and a method for forming the same.

BACKGROUND

With rapid development of semiconductor manufacturing technology, semiconductor devices are developed towards higher component density and higher degree of integration. In order to adapt to a smaller critical dimension, a channel length of an existing planar metal-oxide-semiconductor field-effect transistor (MOSFET) is also increasingly small. However, as a channel length of a device keeps shrinking, the channel control capability of a gate structure deteriorates, and there is increasing difficulty in pinching the channel off by a gate voltage, resulting in a higher possibility of subthreshold leakage, that is, the so-called short-channel effect (SCE). Consequently, the electrical performance of the semiconductor device may be degraded.

When forming a semiconductor device, contact holes need to be formed for a source region, a drain region, and a gate structure of a transistor, and are filled with metal materials to form metal plugs for electrical connection between transistors and interconnection metal layers. However, when filling the metal layer in the contact holes, diffused ions may cause damages to the semiconductor components under the contact holes, which affects the quality of the formed semiconductor device.

Thus, there is a need to provide a semiconductor device with improved quality and performance, and method for forming the same.

SUMMARY

To address the problems described above, embodiments and implementations of the present disclosure provide a semiconductor device and formation method thereof to provide the formed semiconductor device with higher quality and improved performance.

One aspect of the present disclosure may provide a method for forming a semiconductor device, including: providing a base; forming an interlayer dielectric layer over the base; forming a contact hole by etching the interlayer dielectric layer; forming a barrier layer over the base in the contact hole; and forming a metal layer over the barrier layer. The contact hole exposes a portion of a surface of the base. The metal layer fully fills the contact hole.

Optionally, a material of the barrier layer may include cobalt (Co) or tantalum (Ta).

Optionally, forming the barrier layer may include a selective growth method, a chemical vapor deposition (CVD) method, an atomic layer deposition (ALD) method, or a combination thereof.

Optionally, forming the contact hole may include a dry etching process or a wet etching process.

Optionally, a material of the metal layer may include tungsten (W).

Optionally, forming the metal layer may include a CVD method, a selective growth method, an ALD method, or a combination thereof.

Optionally, forming the metal layer includes: forming a first metal layer in the contact hole using a selective growth method; and forming a second metal layer in the contact holes using a CVD method on the first metal layer and on the interlayer dielectric layer.

Optionally, the method may further include, after forming the first metal layer and before forming the second metal layer, forming an adhesion layer on the interlayer dielectric layer.

Optionally, the first metal layer may have a top surface higher than the interlayer dielectric layer.

Optionally, the method further may include: forming a reactive metal layer at a bottom and on a sidewall of the contact hole and over the interlayer dielectric layer; and forming a diffusion barrier layer over the reactive metal layer.

Optionally, the method may further include: after forming the diffusion barrier layer over the reactive metal layer, forming a silicide layer by reacting a portion of the reactive metal layer at the bottom of the contact hole with a portion of the surface of the base.

Optionally, the method may further include forming the silicide layer by a directed self-assembly process, a thermal treatment process, or a combination thereof.

Optionally, forming the barrier layer over the base in the contact hole may include forming the barrier layer on the diffusion barrier layer, the diffusion barrier layer being formed at the bottom and the sidewall surface of the contact hole. The silicide layer is formed at the bottom of the contact hole and between the diffusion barrier layer and the base. A remaining portion of the metal layer that is unreacted is between the sidewall of the contact hole and the diffusion barrier layer.

Optionally, the method may further include, before forming the barrier layer, removing the diffusion barrier layer and a remaining portion of the metal layer that is unreacted.

Optionally, forming the barrier layer over the base in the contact hole may include forming the barrier layer over the silicide layer at the bottom of the contact hole.

Another aspect of the present disclosure may provide a semiconductor device, including: a base, an interlayer dielectric layer, a contact hole, a silicide layer, a barrier layer, and a metal layer. The interlayer dielectric layer is formed over the base. A contact hole is formed in the interlayer dielectric layer and exposes a portion of a surface of the base. The silicide layer is formed on the portion of the surface of the base and at a bottom of the contact hole. The barrier layer is formed over the silicide layer in the contact hole. The metal layer is formed over the barrier layer in the contact hole.

Optionally, a material of the barrier layer includes cobalt (Co) or tantalum (Ta).

Optionally, the device further includes a reactive metal layer, which is formed on a sidewall of the contact hole, between the interlayer dielectric layer and, the barrier layer and the metal layer in the contact hole.

Optionally, the device further includes a diffusion barrier layer, which is formed on the silicide layer and the reactive metal layer and in the contact hole. The barrier layer and the metal layer are formed on the diffusion barrier layer.

Compared to the existing technology, the technical solutions of the present disclosure have the following advantages.

For example, before the metal layer is filled in the contact hole, the barrier layer is formed at the bottom of the contact hole, followed by forming a metal layer over the barrier layer. The barrier layer can block the diffused ions. When filling the metal layer in contact holes, ions with relatively large electronegativity are easily generated. Ions in the barrier layer can absorb such ions with relatively large electronegativity to effectively block the ions with relatively large electronegativity from diffusing into the base under the contact hole. As such, the diffusion of the ions generated when forming the metal layer with relatively large electronegativity is avoided, and damages to the semiconductor device are reduced or eliminated. Performance of the formed semiconductor device is thus improved.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

FIGS. 1 to 4 illustrate schematic diagrams of cross-sectional structures at certain stages during a process of forming a semiconductor device.

Figure 1:
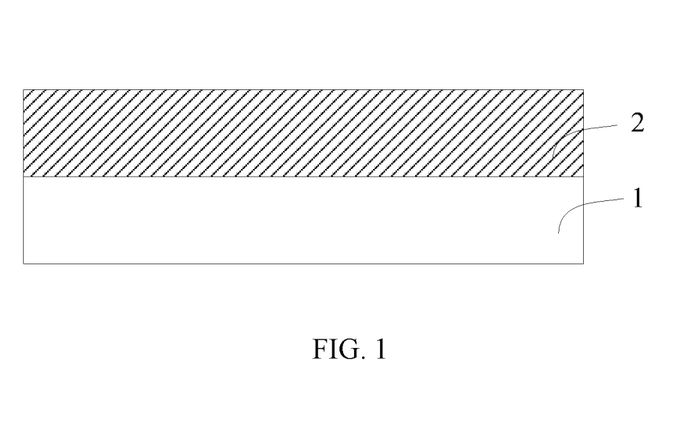
FIG. 1 to FIG. 4 illustrate schematic diagrams of cross-sectional structures at certain stages during a process of forming a semiconductor device.
Figure 2:
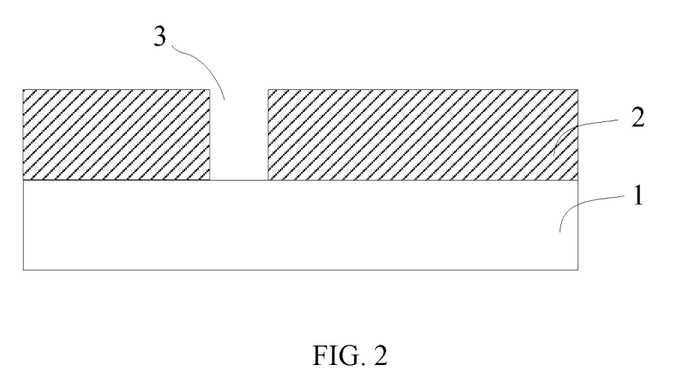
Figure 3:
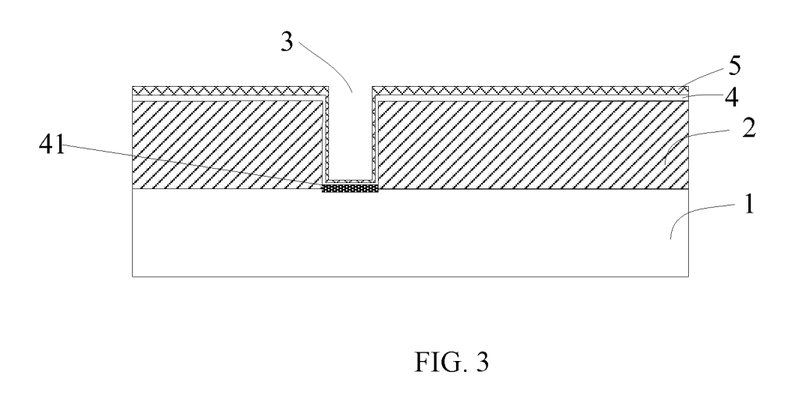
Figure 4:
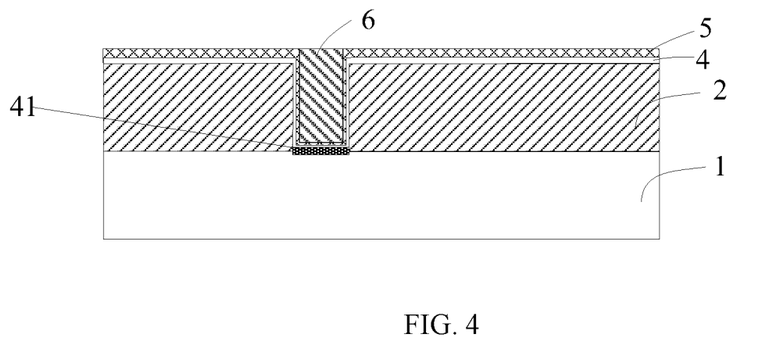

Referring to FIG. 1, a base 1 is provided, and an interlayer dielectric layer 2 is formed over the base 1. Referring to FIG. 2, the interlayer dielectric layer 2 is etched to form a contact hole 3 in the interlayer dielectric layer 2. Referring to FIG. 3, a reactive metal layer 4 and a diffusion barrier layer 5 are sequentially formed on bottom and sidewalls of the contact hole 3 and over the interlayer dielectric layer 2. The reactive metal layer 4 and the surface of the base 1 form a silicide layer 41. Referring to FIG. 4, a metal layer 6 is filled in the contact hole 3 to form a metal plug, and a top surface of the metal layer 6 is coplanar with a top surface of the diffusion barrier layer 5.

Inventors of present disclosure have found that the above formed semiconductor devices have poor performance, low yield, and low stability and are prone to failure, limiting further application of the semiconductor devices. For example, the formed metal layer 6 has easily diffusible fluorine (F) ions, which cause damages to the silicide layer 41 under the contact hole 3 and to the remaining unreacted metal layer 4. Thus, the formed semiconductor devices have poor performance, low yield and low stability.

Inventors of present disclosure have found that, before the metal layer is filled in the contact hole, a barrier layer may be formed at the bottom of the contact hole. The barrier layer is used to block the diffusion F ions in the metal layer to effectively prevent the diffusion of the F ions, thereby reducing the damages of the silicide layer and improving the quality and performance of the formed semiconductor devices.

To make the above-mentioned objectives, features, and advantages of the present disclosure clearer, embodiments of the present disclosure are described in details in connection with the accompanying drawings.

Figure 9:
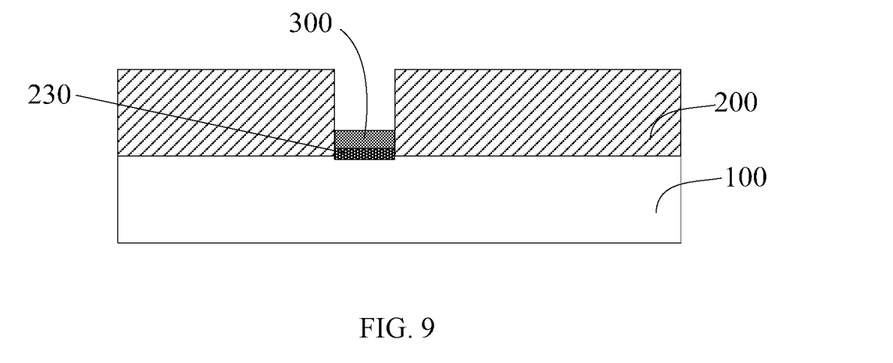
Figure 10:
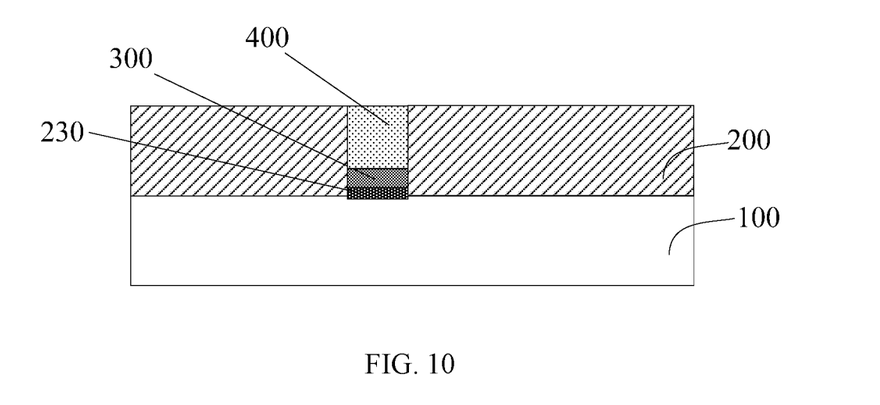
Figure 11:
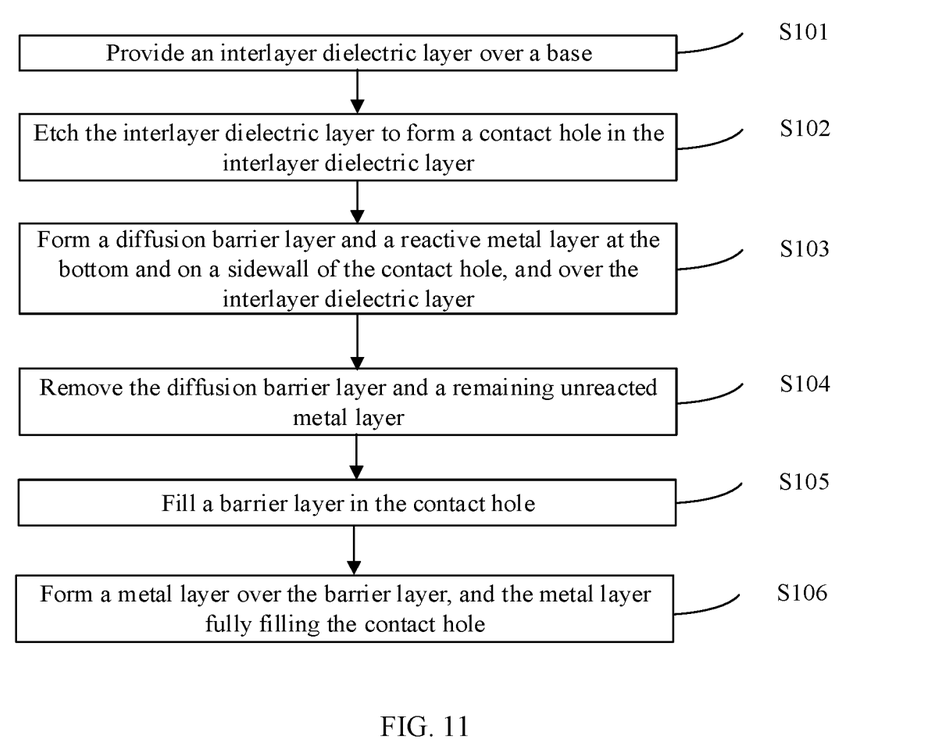
FIG. 11 illustrates a flowchart of an exemplary method for forming a semiconductor device according to some embodiments of the present disclosure.

FIG. 5 to FIG. 10 illustrate schematic diagrams of cross-sectional structures at certain stages during a process of forming an exemplary semiconductor device according to some embodiments of the present disclosure. FIG. 11 illustrates a flowchart of an exemplary method for forming a semiconductor device according to some embodiments of the present disclosure.

Figure 5:
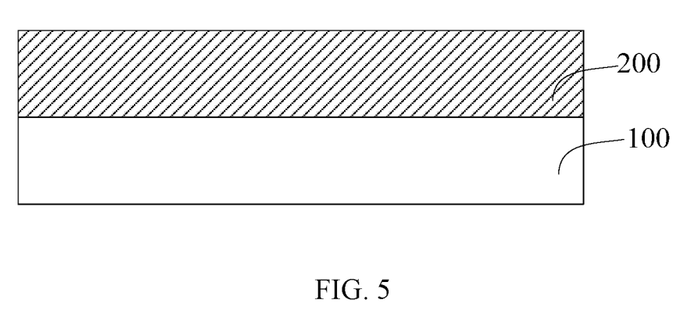
FIG. 5 to FIG. 10 illustrate schematic diagrams of cross-sectional structures at certain stages during a process of forming an exemplary semiconductor device according to some embodiments of the present disclosure.

Referring to FIG. 11, in S101, an interlayer dielectric layer is provided over a base. FIG. 5 illustrates a corresponding structure.

As shown in FIG. 5, an interlayer dielectric layer 200 is provided over a base 100.

In some embodiments, the base 100 includes a substrate, and a semiconductor device, such as a memory device and a logic device, over the substrate.

In some embodiments, a material of the interlayer dielectric layer 200 includes silicon oxide.

In other embodiments, the material of the interlayer dielectric layer 200 may include silicon nitride (SiN), silicon boronitride (SiBN), silicon oxycarbonitride (SiOCN), silicon oxynitride (SiON), or a combination thereof.

In some embodiments, the interlayer dielectric layer is formed over the base 100 by a chemical vapor deposition (CVD) process. Parameters of the CVD process include a precursor gas including oxygen ($O_2$), ammonia ($NH_3$), and tri-silyl-amine ($N(SiH_3)_3$) gas, a flow rate of oxygen ranging from 20 sccm to 10000 sccm, a flow rate of $NH_3$ gas ranging from 20 sccm to 10000 sccm, a flow rate of $N(SiH_3)_3$ gas ranging from 20 sccm to 10000 sccm, a chamber pressure of 0.01 Torr to 10 Torr, and a chamber temperature of 30° C. to 90° C.

Figure 6:
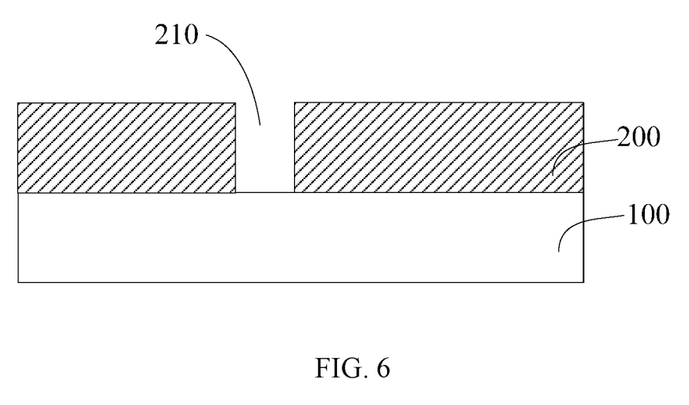

Returning to FIG. 11, in S102, the interlayer dielectric layer is etched to form a contact hole in the interlayer dielectric layer. FIG. 6 illustrates a corresponding structure.

As shown in FIG. 6, the interlayer dielectric layer 200 is etched to form a contact hole in the interlayer dielectric layer 200. The bottom of the contact hole 210 exposes a portion of a surface of the base 100.

In some embodiments, forming the contact hole 210 includes a dry etching process. Parameters of the dry etching process include a reactive gas mixture including carbon tetrafluoride ($CF_4$) and fluoromethane ($CH_3F$), a flow rate of carbon tetrafluoride ($CF_4$) ranging from 20 sccm to 200 sccm, a flow rate of fluoromethane ($CH_3F$) ranging from 20 sccm to 50 sccm, a source radio-frequency (RF) power ranging from 200 W to 500 W, and a chamber pressure ranging from 1 Torr to 10 Torr.

In other embodiments, forming the contact hole 210 includes a wet etching process.

Figure 7:
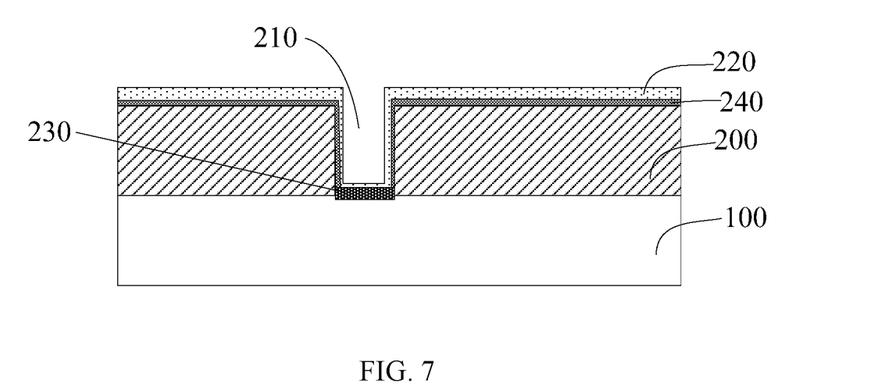

Referring to FIG. 11, in S103, a diffusion barrier layer and a reactive metal layer are formed at the bottom and on a sidewall of the contact hole, and over the interlayer dielectric layer. FIG. 7 illustrates a corresponding structure.

As shown in FIG. 7, a diffusion barrier layer 220 is formed at the bottom and on the sidewall of the contact hole 210, and over the interlayer dielectric layer 200.

In some embodiments, before a diffusion barrier layer 220 is formed, a reactive metal layer 240, such as a titanium (Ti)

layer, is formed at the bottom and on the sidewall of the contact hole 210, and over the interlayer dielectric layer 200. The reactive metal layer 240 may react with the base 100 to form a silicide layer 230, under the diffusion barrier layer 220.

In some embodiments, forming the silicide layer 230 includes a directed self-assembly (DSA) process. The silicide layer 230 is formed in a thermal treatment process.

In some embodiments, a material of the diffusion barrier layer 220 includes titanium nitride (TiN). In other embodiments, the material of the diffusion barrier layer may include tantalum nitride (TaN), etc.

In some embodiments, by forming the diffusion barrier layer 220 over the reactive metal layer 240 before forming the silicide layer 230, the reactive metal layer 240 is prevented from being oxidized during the formation process of the silicide layer 230. As such, defects, such as air gaps, are avoided for the formed silicide layer 230, and the performance of the semiconductor device is not affected.

Figure 8:
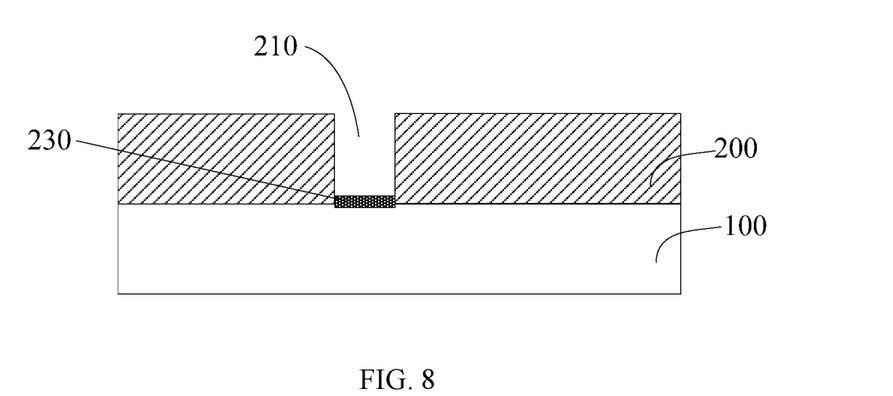

Returning to FIG. 11, in S104, the diffusion barrier layer and the remaining unreacted metal layer are removed. FIG. 8 illustrates a corresponding structure.

As shown in FIG. 8, the diffusion barrier layer 220 and a remaining portion of the reactive metal layer 240 that is not reacted (i.e., a remaining unreacted metal layer 240) are removed.

In some embodiments, by removing the diffusion barrier layer 220 and the remaining unreacted metal layer 240, contact resistance is reduced between the diffusion barrier layer 220 and the silicide layer 230 that are subsequently formed. For example, heat generation may thus be reduced in the semiconductor device. The volume of the metal layer being subsequently filled in the contact hole 210 is also increased by removing the diffusion barrier layer 220 and the remaining unreacted metal layer 240.

In some embodiments, the diffusion barrier layer 220 and the remaining unreacted metal layer 240 are removed using a wet etching process.

Returning to FIG. 11, in S105, a barrier layer is filled in the contact hole. FIG. 9 illustrates a corresponding structure.

As shown in FIG. 9, a barrier layer 300 is filled in the contact hole 210.

In some embodiments, before the barrier layer 300 is formed, the diffusion barrier layer 220 and the remaining unreacted metal layer 240 are removed. In other embodiments, the diffusion barrier layer 200 and the remaining unreacted metal layer 240 may not be removed before the barrier layer 300 is formed.

In some embodiments, a material of the barrier layer 300 includes cobalt (Co). In other embodiments, the material of the barrier layer 300 may include tantalum (Ta), etc.

In some embodiments, forming the barrier layer 300 includes a selective growth method. In other embodiments, forming the barrier layer 300 may include a CVD process, an atomic layer deposition (ALD) process, or a combination thereof.

In some embodiments, by forming the barrier layer 300 using the selective growth method, on one aspect, the barrier layer 300 formed by the selective growth method may provide desired density to play a good barrier role. On the other aspect, the barrier layer 300 formed by the selective growth method may grow from the bottom of the contact hole 210, and has little impact on the size of the contact hole 210. In this manner, the metal layer may be subsequently filled the contact hole 210 with larger volume to reduce the contact resistance of the formed semiconductor device. The performance of the formed semiconductor device is improved.

In some embodiments, since the diffusion barrier layer 220 and the remaining unreacted metal layer 240 have a larger resistance, the contact resistance of the formed semiconductor device can be reduced by removing the diffusion barrier layer 200 and the remaining unreacted metal layer 240 before forming the barrier layer 300.

In other embodiments, the diffusion barrier layer 220 and the remaining unreacted metal layer 240 may not be removed. The barrier layer 300 is formed at the bottom and on a sidewall of the diffusion barrier layer 220. The formed barrier layer 300 can block the diffusion of the F ions and prevent the damages to the silicide layer 230 and the remaining unreacted metal layer 240. Moreover, the barrier layer 300 grows from the bottom of the diffusion barrier layer 220 and gradually grows onto the sidewall using the selective growth method. The opening size of the contact hole 210 is ensured to remain unchanged during the formation process of the barrier layer 300, such that the subsequent filling of the metal layer is not affected.

In some embodiments, parameters for forming the barrier layer 300 include an organic source of CoDCP (e.g., CpCo $(Co)_2$ or $(C_5H_5)Co(CO)_2$), a reaction gas including hydrogen $(H_2)$, ammonia $(NH_3)$, and argon (Ar), a flow rate of hydrogen $(H_2)$ ranging from 1000 sccm to 8000 sccm, a flow rate of ammonia $(NH_3)$ ranging from 1000 sccm to 5000 sccm, a flow rate of argon (Ar) ranging from 10 sccm to 500 sccm, source RF power ranging from 100 W to 2000 W, a temperature ranging from 100° C. to 400° C., and a pressure ranging from 10 Torr to 40 Torr.

In some embodiments, a thickness of the barrier layer 300 ranges from 20 Å to 100 Å. When the thickness of the barrier layer 300 is less than 20 Å, the formed barrier layer 300 may not have desirable blocking effect of the diffusion of the ions. When the thickness of the barrier layer 300 is more than 100 Å, the formed barrier layer 300 is relatively thick, which results in a smaller volume for the subsequently formed metal layer.

Returning to FIG. 11, in S106, a metal layer is formed over the barrier layer, and the metal layer may fully fill the contact hole. FIG. 10 illustrates a corresponding structure.

As shown in FIG. 10, a metal layer 400 is formed on the barrier layer 300, and the metal layer 400 may fully fill the contact hole 210.

In some embodiments, a material of the metal layer 400 includes tungsten (W).

In some embodiments, forming the metal layer 400 includes a combination of a selective growth method and a CVD method.

In other embodiments, forming the metal layer 400 may include a CVD method. The metal layer 400 is planarized to form a metal plug.

In some embodiments, after the metal layer 400 is formed, the metal layer 400 is planarized until exposing the interlayer dielectric layer 200.

Figure 10A:
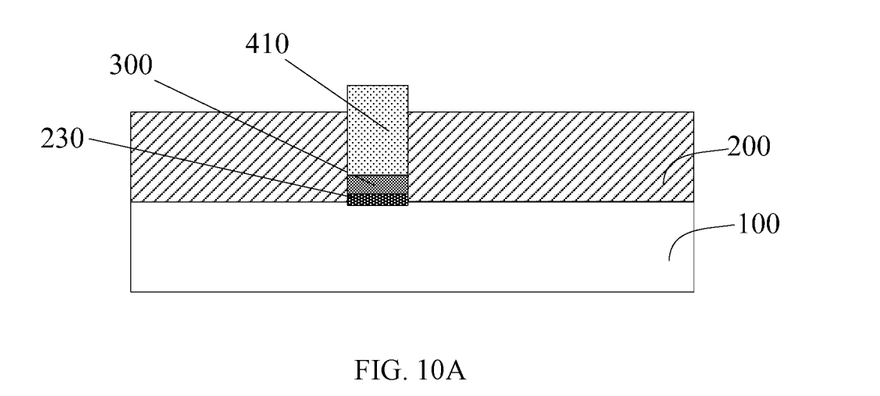
Figure 10B:
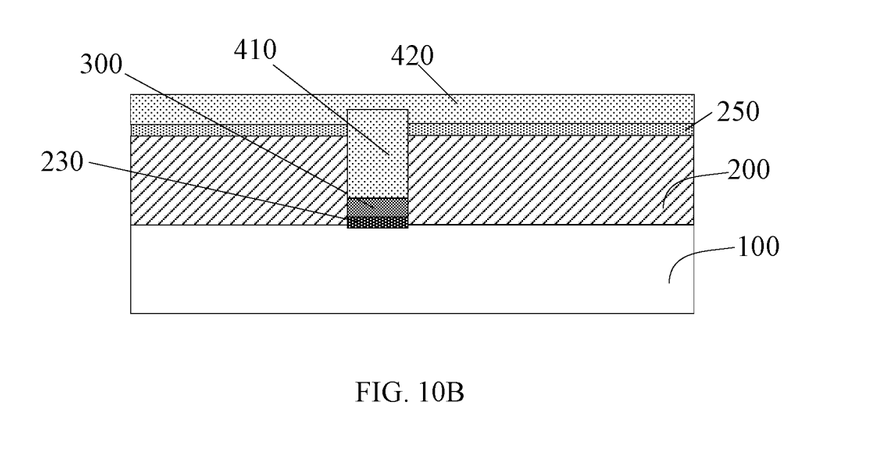

Referring to FIG. 10A and FIG. 10B, forming the metal layer 400 includes the following processes. As shown in FIG. 10A, a first metal layer 410 fully fills the contact hole 210 using the selective growth method. A top surface of the first metal layer 410 is higher than the surface of the interlayer dielectric layer 200.

As shown in FIG. 10B, a second metal layer 420 is formed on the surface of interlayer dielectric layer 200 by using a CVD method.

In some embodiments, before the second metal layer 420 is formed, an adhesion layer 250 is formed on the surface of the interlayer dielectric layer 200. The adhesion layer 250 facilitates the formed the second metal layer 420 to better adhere to the interlayer dielectric layer 200, so as to prevent the second metal layer 400 from peeling off during a subsequent planarization process.

After the first metal layer 410 and the second metal layer 420 are formed, a chemical mechanical polishing process is performed to planarize the surfaces of the first metal layer 410 and the second metal layer 420 until the surface of the interlayer dielectric layer 200 is exposed (e.g., as shown in FIG. 10).

In some embodiments, using the selective growth method and the CVD method to form the metal layer 400 includes the following reasons. First, the first metal layer 410 is formed by the selective growth method, so that the formed first metal layer 410 has high density. In addition, the first metal layer 410 is formed gradually from the bottom of the contact hole 210 by the selective growth method, and forming the first metal layer 410 in the contact hole 210 all at once can reduce the damages to the formed devices. Further, using the CVD method to form the metal layer 400 can provide an extra portion of the material for planarizing the metal layer 400, thereby facilitating forming the metal layer 400 with good surface quality.

During the process of forming the metal layer 400, ions with relatively large electronegativity, such as F ions, are easily generated. The F ions are easily diffused, which may cause damages to the silicide layer 230 and reducing the performance of the formed semiconductor device. When the barrier layer 300 is formed at the bottom of the contact hole 210 before forming the metal layer 400, the ions inside the barrier layer 300 absorb the F ions to effectively prevent the diffusion of the F ions and reduce the damages to the silicide layer 230 by the F ions. Meanwhile, the barrier layer 300 formed by the selective growth method grows from the bottom of the contact hole 210, which allows the size of the contact hole 210 with a small or no change during the process of forming the barrier layer 300. The volume of the formed metal layer 400 is thus increased to improve the performance of the formed semiconductor device.

Various embodiments also provide a semiconductor device. The semiconductor device includes a base 100, an interlayer dielectric layer 200 over the base 100, a contact hole 210 in the interlayer dielectric layer 200 and exposing the base 100 at the bottom, a silicide layer 230 over the base 100 at the bottom of the contact hole 210, a barrier layer 300 over the silicide layer 230 in the contact hole 210, a metal layer 400 over the barrier layer 300 in the contact hole 210 and fully filling the contact hole 210.

The above-detailed descriptions only illustrate exemplary embodiments of the present invention and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor device, comprising:
   providing a base;
   forming an interlayer dielectric layer over the base;
   forming a contact hole by etching the interlayer dielectric layer, the contact hole exposing a portion of a surface of the base;
   forming a reactive metal layer at a bottom and on a sidewall of the contact hole and over the interlayer dielectric layer;
   forming a diffusion barrier layer over the reactive metal layer;
   after forming the diffusion barrier layer over the reactive metal layer, forming a silicide layer by reacting a portion of the reactive metal layer at the bottom of the contact hole with a portion of a surface of the base;
   removing the diffusion barrier layer and a remaining portion of the metal layer that is unreacted;
   after removing the diffusion barrier layer and the remaining portion of the metal layer that is unreacted, forming a barrier layer over the base in the contact hole; and
   forming a metal layer over the barrier layer and fully filling the contact hole, including:
      forming a first metal layer in the contact hole;
      forming a second metal layer on the first metal layer; and
      after forming the first metal layer and before forming the second metal layer, forming an adhesion layer on the interlayer dielectric layer.

2. The method according to claim 1, wherein a material of the barrier layer includes cobalt (Co) or tantalum (Ta).

3. The method according to claim 1, wherein forming the barrier layer includes, a chemical vapor deposition (CVD) method, or an atomic layer deposition (ALD) method, or a combination thereof.

4. The method according to claim 1, wherein forming the contact hole includes a dry etching process or a wet etching process.

5. The method according to claim 1, wherein a material of the metal layer includes tungsten (W).

6. The method according to claim 1, wherein forming the metal layer includes a CVD method, an ALD method, or a combination thereof.

7. The method according to claim 1, wherein:
   the first metal layer has a top surface higher than the interlayer dielectric layer.

8. The method according to claim 7, further including:
   planarizing the first metal layer and the second metal layer until exposing the interlayer dielectric layer.

9. The method according to claim 1, further comprising:
   forming the silicide layer by a directed self-assembly process, a thermal treatment process, or a combination thereof.

10. The method according to claim 1, wherein forming the barrier layer over the base in the contact hole includes:
    forming the barrier layer on the diffusion barrier layer, the diffusion barrier layer being formed at the bottom and the sidewall surface of the contact hole, wherein:
       the silicide layer is formed at the bottom of the contact hole and between the diffusion barrier layer and the base, and
       a remaining portion of the metal layer that is unreacted is between the sidewall of the contact hole and the diffusion barrier layer.

11. The method according to claim 1, wherein forming the barrier layer over the base in the contact hole includes:
    forming the barrier layer over the silicide layer at the bottom of the contact hole.

12. A method for forming a semiconductor device, comprising:
    providing a base;

forming an interlayer dielectric layer over the base;
forming a contact hole by etching the interlayer dielectric layer, the contact hole exposing a portion of a surface of the base;
forming a reactive metal layer at a bottom and on a sidewall of the contact hole and over the interlayer dielectric layer;
forming a diffusion barrier layer over the reactive metal layer;
after forming the diffusion barrier layer over the reactive metal layer, forming a silicide layer by reacting a portion of the reactive metal layer at the bottom of the contact hole with a portion of a surface of the base;
removing the diffusion barrier layer and a remaining portion of the metal layer that is unreacted;
after removing the diffusion barrier layer and the remaining portion of the metal layer that is unreacted, forming a barrier layer over the base in the contact hole; and
forming a metal layer over the barrier layer, the metal layer fully filling the contact hole.

* * * * *